United States Patent
Fazelpour et al.

(10) Patent No.: US 6,611,048 B1
(45) Date of Patent: Aug. 26, 2003

(54) EXPOSED PADDLE LEADFRAME FOR SEMICONDUCTOR DIE PACKAGING

(75) Inventors: Siamak Fazelpour, Irvine, CA (US); Roberto U. Villanueva, Rancho Santa Margarita, CA (US)

(73) Assignee: Skyworks Solutions, Inc., Irvine, CA (US)

(*) Notice: Subject to any disclaimer, the term of this patent is extended or adjusted under 35 U.S.C. 154(b) by 0 days.

(21) Appl. No.: 09/648,879

(22) Filed: Aug. 25, 2000

(51) Int. Cl.[7] .................. H01L 23/495; H01L 23/48
(52) U.S. Cl. .................. 257/670; 257/692; 257/696; 257/698
(58) Field of Search .................. 257/666, 670–671, 257/672, 692, 696, 698, 701–703, 674, 676

(56) References Cited

U.S. PATENT DOCUMENTS 5,378,924 A * 1/1995 Liang .................. 257/675
5,430,331 A    7/1995 Hamzehdoost et al.
6,008,528 A * 12/1999 Go et al.
6,177,718 B1 * 1/2001 Kozono .................. 257/666
6,329,705 B1 * 12/2001 Ahmad

* cited by examiner

Primary Examiner—Wael Fahmy
Assistant Examiner—Dilinh Nguyen
(74) Attorney, Agent, or Firm—Farjamai & Farjamai LLP

(57) ABSTRACT

According to one embodiment, a leadframe having at least one tab is placed inside a mold cavity. During the molding process, the ceiling of the mold cavity is pressed against the at least one tab, which in turn causes a bottom surface of the leadframe to be pressed firmly against a floor of the mold cavity. When a mold compound is injected into the mold cavity, the mold compound is prevented from reaching under the bottom surface of the leadframe. In one embodiment, the tabs are etched into one of the tie bars in the leadframe. The tabs are then mechanically formed at a nonzero angle with respect to a plane of a frame of the leadframe.

16 Claims, 4 Drawing Sheets

EXPOSED PADDLE LEADFRAME FOR SEMICONDUCTOR DIE PACKAGING

BACKGROUND OF THE INVENTION

1. Field of the Invention

The present invention is generally in the field of semiconductor manufacturing. More specifically, the invention is in the field of semiconductor die packaging.

2. Background Art

Leadframe based molded packages are commonly used in semiconductor packaging. FIG. 1A shows a top view of leadframe 100. Paddle 102 of leadframe 100 is attached to the remainder of leadframe 100 by four tie bars 140, 142, 144, and 146. There is one tie bar at each corner of paddle 102. Tie bars 140, 142, 144, and 146 are attached to dam bar 101 of leadframe 100. A number of inner leads 112 are situated on all four sides of leadframe 100. The top surface of paddle 102 is silver-plated copper while the bottom surface of paddle 102 is unplated copper. Tie bars 140, 142, 144, and 146, A and inner leads 112 are also copper with silver plating on the top side where bond wires will be attached.

Semiconductor die 114 is attached to the top surface of paddle 102 on leadframe 100. Bond wires (not shown in any of the Figures) are bonded between semiconductor die 114 and leadframe 100. These bond wires have a first end bonded to a respective bonding pad. An example of a bonding pad is pointed to as bonding pad 116 in FIG. 1A. A second end of each bond wire is bonded to a respective inner lead 112. Bonding pads 116 can be aluminum while the bond wires can be gold or aluminum.

In FIG. 1A, leadframe 100 has not yet been through the molding process, thus leadframe 100 remains unencapsulated in mold compound. In a subsequent stage of the fabrication process, leadframe 100 is placed in a mold cavity in a molding machine and the entire die, bond wires, bonding pads, and paddle are encapsulated in a mold compound, leaving the outer leads of the package (not shown) exposed for soldering to the printed circuit board.

By way of background, in many RF applications where a leadframe based molded package is used, there is a need for a low inductance on the ground connection to the semiconductor die since the performance of various devices on the die can be significantly affected by inductance on the ground connection. One cause of high inductance on the ground connection is the relatively long path used to connect the ground of the semiconductor die to the ground of the printed circuit board. This long path includes, at a minimum, the length of a bond wire and a lead to provide a connection between the semiconductor ground and the printed circuit board ground. The bond wire utilized to make the ground connection could have an inductance of from one to three nano henrys. In addition, the leads on the leadframe could have a length of several millimeters and could result in an additional inductance of from three to six nano henrys. Thus, using the method discussed above results in an undesired inductance of from four to nine nano henrys on the ground connection of the semiconductor die.

In an effort to reduce the inductance values on the ground connection of the semiconductor die, an "exposed paddle" leadframe based molded package was developed. In an exposed paddle leadframe based molded package, the bottom surface of the paddle is not encapsulated in mold compound. The metal on the bottom surface of the paddle is left exposed in order to electrically connect the bottom surface of the paddle to the printed circuit board ground during a re-flow solder process. An exposed paddle leadframe is also referred to as a "deep downset" leadframe since the leadframe paddle resides in a plane below the rest of the leadframe. In other words, the paddle is set lower so that the bottom surface of the paddle would not be covered by the mold compound to be applied to the leadframe in a subsequent step. As such, the bottom surface of the paddle would remain exposed for soldering to the printed circuit board ground.

In an exposed paddle leadframe based molded package, the ground carrying bond wire is bonded to the ground pad on the semiconductor die. However, in contrast to an "unexposed paddle" leadframe based molded package, in an exposed paddle leadframe based molded package the second end of the bond wire is bonded to the grounded paddle of the leadframe instead of being bonded to a lead of the leadframe. By utilizing this method, the longer path of a lead and a bond wire for ground connection is replaced with the shorter path of a bond wire without the need to go through the lead. Moreover, the length of the bond wire itself is also shorter since the bond wire does not have to reach out to a lead, and instead connects to the grounded paddle. The inductance on these shorter bond wires can be as little as 0.3 to 0.5 nano henries. As stated above, the exposed bottom side of the paddle of the leadframe is soldered to the ground of the printed circuit board.

Thus, by using the paddle to connect directly to the ground of the printed circuit board, a very low inductance ground connection is made. A typical value for the total inductance of this connection between a ground pad of the semiconductor die and the ground of the printed circuit board is 0.5 nano henrys. Thus, the total inductance created on the ground connections of the semiconductor die has been reduced from as much as nine nano henrys to as little as 0.5 nano henrys. This lower inductance increases the performance and reliability of the semiconductor die.

Therefore, in order to take advantage of the low inductance on the ground connection resulting from an exposed paddle leadframe based molded package, efforts are made during the leadframe fabrication process to ensure that the bottom surface of the leadframe's paddle remains free of mold compound in order to make a good solder connection between the bottom surface of the paddle and the printed circuit board. Thus, attempts are made to design the leadframe in such a way that while the leadframe is in the mold cavity of the molding machine, the bottom surface of the leadframe's paddle is flush with the floor of the mold cavity to prevent mold compound from squeezing under the paddle. However, there is usually some residue of mold compound that penetrates between the bottom surface of the paddle and the floor of the mold cavity. This residue of mold compound left on the bottom surface of the paddle is referred to as "mold flash."

If left on the bottom surface of the paddle, the paddle's bottom surface will comprise thin lines of solder conductive metal situated between non-conductive mold compound. As such, ground current flow would be restricted to thin lines of the solder conducting metal. This will result in a larger inductance in the ground connection of the semiconductor die. In addition, the flash molding may also result in a mechanically unreliable solder connection between the bottom surface of the paddle and the printed circuit board.

Therefore, exposed paddle based molded packages typically undergo another process, called "deflashing," to remove the excess mold compound left on the bottom surface of the paddle, which adds to the cost and time expended in the fabrication process. This deflashing process can be done in a chemical bath or by physical abrasion. In the normal process, deflashing removes some flash molding. However, even after deflashing, usually some mold compound still remains on the bottom surface of the exposed paddle.

The problem of unwanted mold compound on the bottom surface of an exposed paddle is aggravated if the leadframe is deformed in such a way as to cause the bottom surface of the paddle not to be flush with the floor of the mold cavity. This deformation of the leadframe may occur, for example, during the wire bonding or die attach phases of the fabrication process or during the handling of the leadframe by the fabrication personnel. When an exposed paddle leadframe which has been deformed is placed in the mold cavity, the bottom surface of the paddle may not be flush with the floor of the mold cavity. As a result, a significant amount of mold compound may penetrate between the bottom surface of the paddle and the floor of the mold cavity.

FIG. 1B illustrates the effects of leadframe deformation discussed above. FIG. 1B shows a cross section view of leadframe 100 after leadframe 100 has been placed inside mold cavity 150 in a molding machine (the molding machine is not shown in any of the Figures). Where the cross section is taken is shown in FIG. 1A by line 1B, also referred to by numeral 134. As stated above, leadframe 100 is a deep downset leadframe. In other words, leadframe 100 has undergone a mechanical forming process whereby paddle 102 is "set down" under plane 103 in which the remainder of leadframe 100 resides. The initial "downset" value, i.e. the initial vertical distance between the plane of paddle 102 and plane 103 is indicated by numeral 156 in FIG. 1B.

As a result of deformation occurring earlier in the fabrication process, the bottom surface of paddle 102 is no longer flush with floor 158. Instead, there is a gap between floor 158 and the bottom surface of paddle 102. As a result, mold compound 136 has penetrated between the bottom surface of paddle 102 and floor 158 of mold cavity 150. The layer of mold compound that will be left on the bottom side of paddle 102 after the molding process is undesirable for the reasons stated above.

Thus, it is seen that there is need in the art for a method of fabricating deep downset leadframe molded packages which prevents mold compound from contacting the bottom surface of the leadframe paddle during the molding process and therefore eliminates the necessity of a deflashing step and allows for a low-inductance and mechanically reliable solder connection between the bottom surface of the paddle of a leadframe and the printed circuit board, resulting in a reduction in the number of rejected molded packages and an increase in the reliability and performance of the non-rejected molded packages.

SUMMARY OF THE INVENTION

The present invention is directed to an exposed paddle leadframe for semiconductor die packaging. The present invention overcomes the need in the art for a method of fabricating deep downset leadframe molded packages which prevents mold compound from contacting the bottom surface of the leadframe paddle during the molding process and therefore eliminates the necessity of a deflashing step and allows for a low-inductance and mechanically reliable solder connection between the bottom surface of the paddle of a leadframe and the printed circuit board, resulting in a reduction in the number of rejected molded packages and an increase in the reliability and performance of the non-rejected molded packages.

According to one embodiment of the invention, a leadframe having at least one tab is placed inside a mold cavity. During the molding process, the ceiling of the mold cavity is pressed against the at least one tab, which in turn causes a bottom surface of the leadframe to be pressed firmly against a floor of the mold cavity. When a mold compound is injected into the mold cavity, the mold compound is prevented from reaching under the bottom surface of the leadframe.

In one embodiment, the tabs used in the present invention are etched into the inner tie bars in the leadframe. The tabs are then mechanically formed at a nonzero angle with respect to a plane of a frame of the leadframe.

DETAILED DESCRIPTION OF THE INVENTION

The present invention is directed to an exposed paddle leadframe for semiconductor die packaging. Although the invention is described with respect to specific embodiments, the principles of the invention, as defined by the claims appended herein, can obviously be applied beyond the specifically described embodiments of the invention described herein. Moreover, in the description of the present invention, certain details have been left out in order to not obscure the inventive aspects of the invention. The details left out are within the knowledge of a person of ordinary skill in the art.

The drawings in the present application and their accompanying detailed description are directed to merely example embodiments of the invention. To maintain brevity, other embodiments of the invention which use the principles of the present invention are not specifically described in the present application and are not specifically illustrated by the present drawings.

FIGS. 2A through 2D show detailed views of one of the four tie bars of a deep downset leadframe in various stages according to one aspect of the present invention. It is noted that the tabs would be created during a stage of the fabrication process when the entire leadframe, including the paddle, frame bars and leads are etched. As stated above, in one embodiment the tie bars are made of copper. Thus, FIGS. 2A through 2D are used merely to illustrate in more detail the etching of the invention's tab that takes place at the same point in the leadframe fabrication process when the remainder of the leadframe is etched.

Figure 1A:
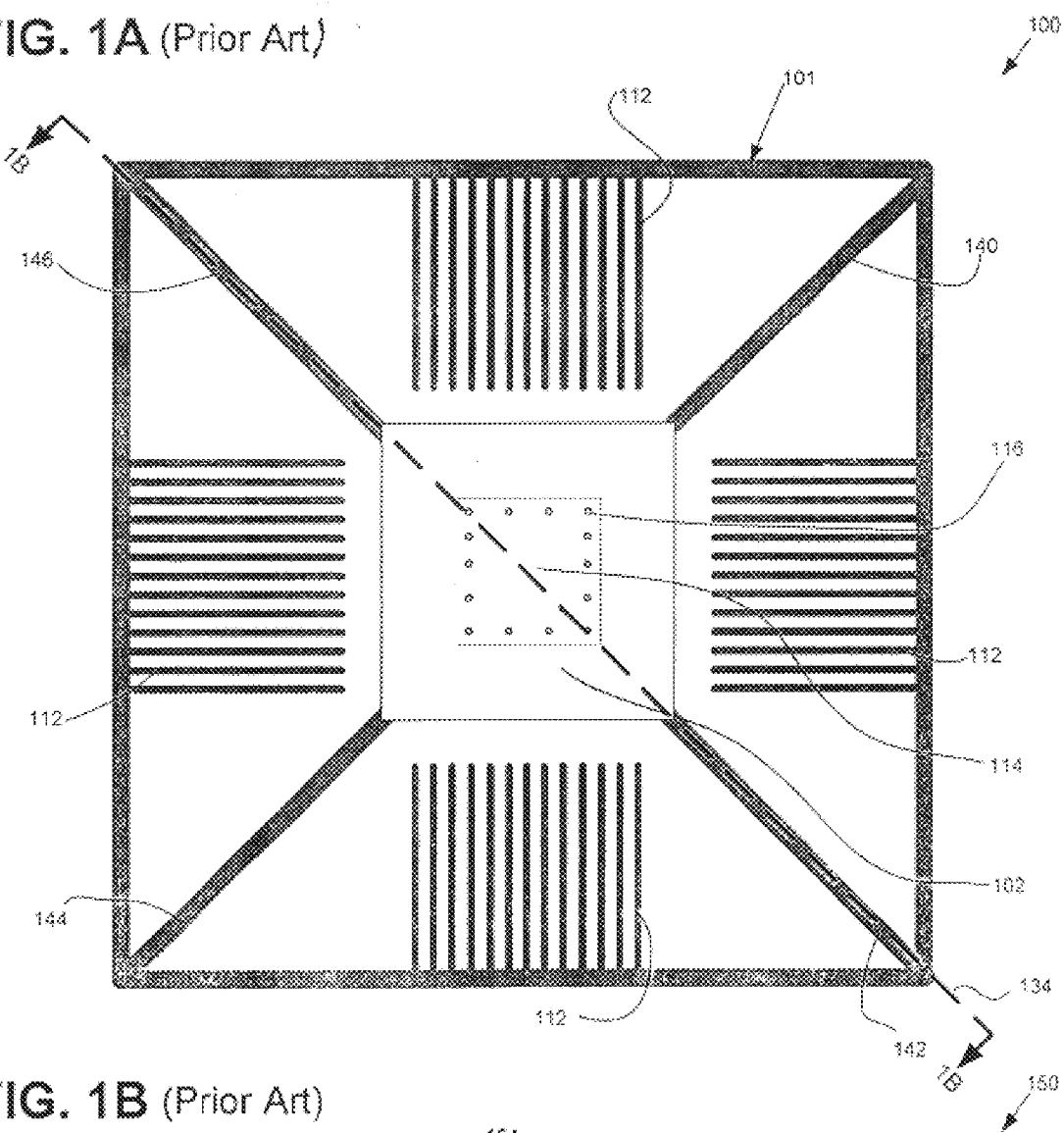
FIG. 1A illustrates a top view of a known leadframe.
Figure 1B:
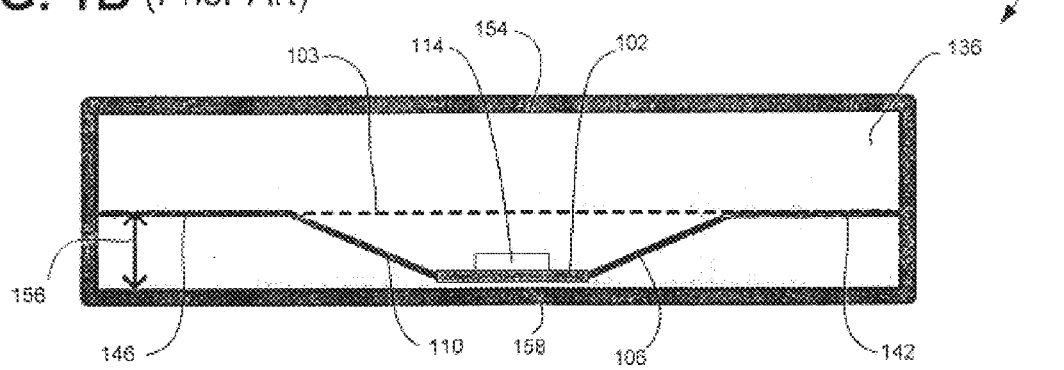
FIG. 1B illustrates a cross section view of a known leadframe after the leadframe has been encapsulated in mold compound in a mold cavity.
Figure 2A:
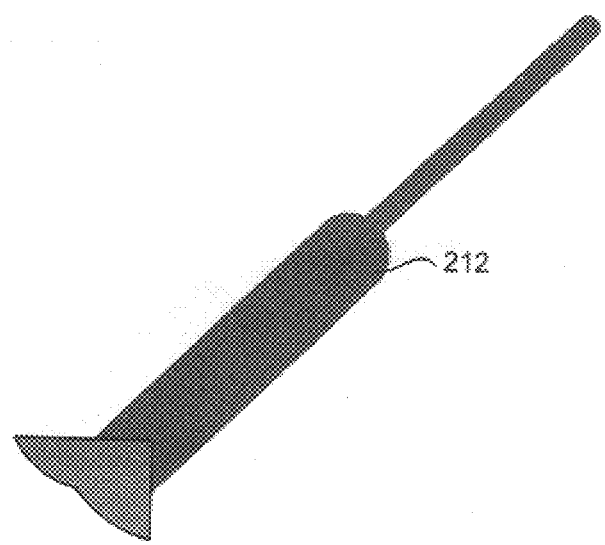
FIG. 2A illustrates a detailed view of the tie bar of a leadframe prior to patterning, etching, and mechanical forming of the invention's tab.
Figure 2B:
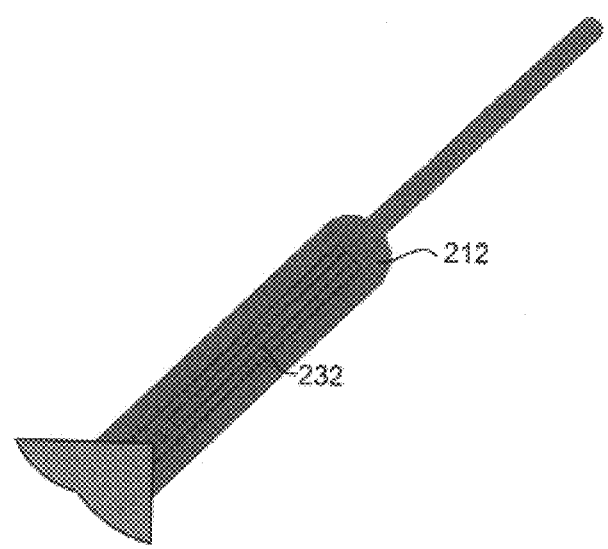
FIG. 2B illustrates a detailed view of the patterning of the invention's tab on a tie bar of a leadframe.
Figure 2C:
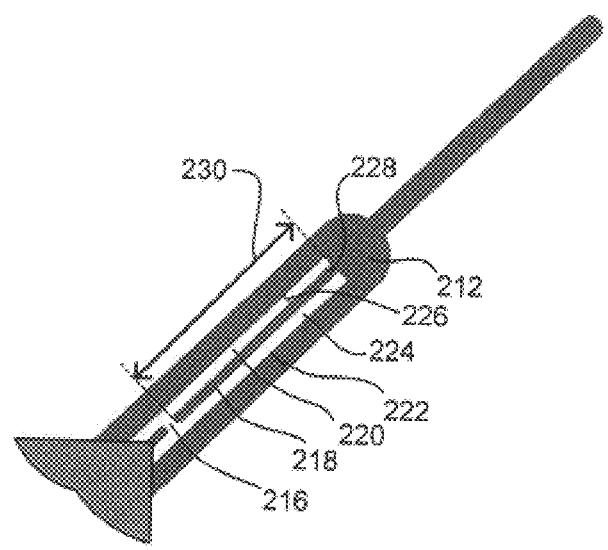
FIG. 2C illustrates a detailed view of the invention's tab after it has been etched in the tie bar of a leadframe.

FIG. 2A shows tie bar 212 prior to the patterning of the tab. Photoresist (not shown) is utilized to pattern the tab into tie bar 212. FIG. 2B shows tie bar 212 after the tab has been patterned. The pattern of the tab is shown as a dashed line, referred to by numeral 232. FIG. 2C shows tie bar 212 after the etching process has removed the copper from etched areas 216, 220, and 224 to form tab 218.

In one embodiment, the width of tab 218, referred to in FIG. 2C by numeral 228, can be approximately 20 mils. The width of etched areas 216, 220, and 224, referred to in FIG. 2C by numeral 226, can be approximately 3 mils. The remaining tie bar width on each side of tab 218, referred to in FIG. 2C by numeral 222, can be approximately 70 mils. It is noted that the various width dimensions discussed immediately above are not drawn to scale in the Figures of the present application. The length chosen for the tabs, referred to in FIG. 2C by numeral 230, is discussed below in relation to FIG. 3B.

Figure 2D:
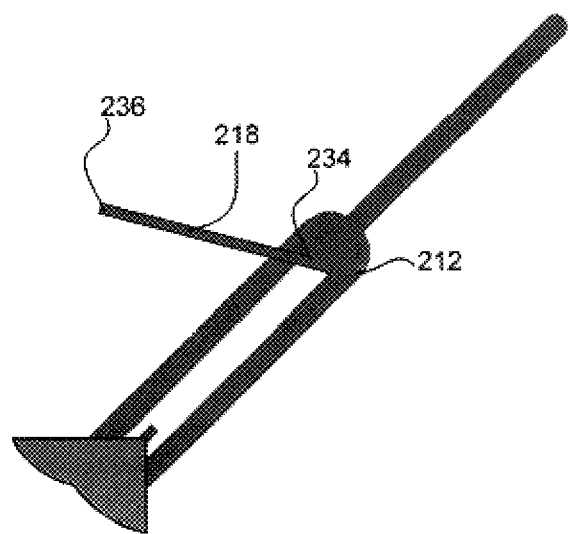
FIG. 2D illustrates a perspective view of the invention's tab after it has been mechanically formed at an upward angle relative to the tie bar.

FIG. 2D shows a perspective view of tie bar 212 after tab 218 has been formed. A first end 234 of tab 218 is attached to tie bar 212 on the leadframe. A second end 236 of tab 218 is unattached to the leadframe. Tab 218 protrudes at an upward angle relative to tie bar 212. In one embodiment, the forming of tab 218, and the three remaining tabs that are not shown, takes place at the same point in the fabrication process when the paddle and tie bars are set down to form the deep downset configuration discussed above. The angle of the tabs relative to the tie bars is discussed below in relation to FIG. 3B below.

Figure 3A:
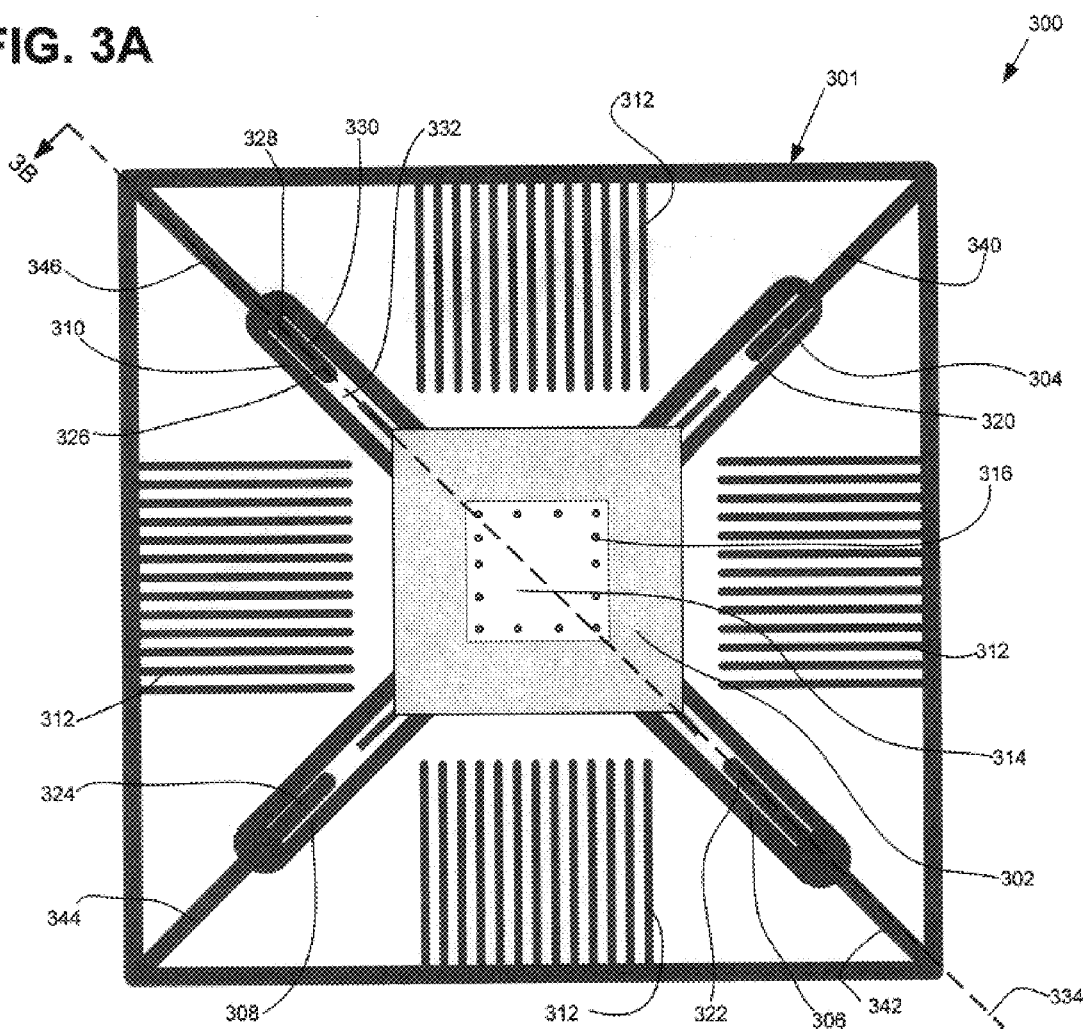
FIG. 3A illustrates a top view of the invention's tabs etched on the tie bars of a leadframe.

FIG. 3A shows a top view of leadframe 300 of an embodiment of the present invention. Photoresist can be used to pattern leadframe 300 in copper in a manner known in the art. In the present embodiment, leadframe 300 is patterned in copper having a thickness of approximately 5 mils. Paddle 302 of leadframe 300 is connected to the remainder of leadframe 300 by four inner tie bars 304, 306, 308, and 310. There is one inner tie bar at each corner of paddle 302. Inner tie bars 304, 306, 308, and 310 are connected to frame 301 of leadframe 300 by four tie bars 340, 342, 344, and 346.

In the present embodiment, leadframe 300 includes semiconductor die 314 attached to the top surface of paddle 302. After semiconductor die 314 is attached to the top surface of paddle 302, bond wires (not shown in any of the Figures) are bonded between semiconductor die 314 and leadframe 300. The bond wires can be gold or aluminum. Each bond wire has a first end bonded to a respective die bonding pad, such as bonding pad 316. A second end of each bond wire would be bonded to a respective inner lead 312 of leadframe 300. However, the bond wires from the ground pads of semiconductor die 314 would be bonded to paddle 302 of leadframe 300.

In the present embodiment, inner tie bars 304, 306, 308 and 310, tie bars 340, 342, 344, and 346, and inner leads 312 can be copper. The top surface of paddle 302 can be silver-plated copper, while the bottom surface of paddle 302 can be unplated copper. Bonding pads 316 can be aluminum. It can be seen from the top view of leadframe 300 shown in FIG. 3A that tabs 320, 322, 324, and 326 have been created in each respective tie bar by the process illustrated in FIGS. 2A through 2D. As discussed above, during the same pat-terning process wherein inner tie bars 304, 306, 308, and 310, inner leads 312, and the rest of leadframe 300 are patterned into a copper film, the invention's tabs 320, 322, 324, and 326 are also patterned in inner tie bars 304, 306, 308, and 310. A wet etch is then performed, in a manner known in the art, to remove the unwanted areas of copper. As an example, during the wet etch, unwanted copper is removed from etched areas 328, 330, and 332 on inner tie bar 310. The same etching process takes place with respect to inner tie bars 304, 306, and 308. It is noted that tabs 320, 322, 324, and 326 are at an upward angle relative to tie bars 340, 342, 344, and 346 and also relative to inner tie bars 304, 306, 308, and 310. For this reason, in the top view shown in FIG. 3A each of the tabs 320, 322, 324, and 326 appears slightly shorter than the perspective view of the exemplary tab shown in FIG. 2C.

Figure 3B:
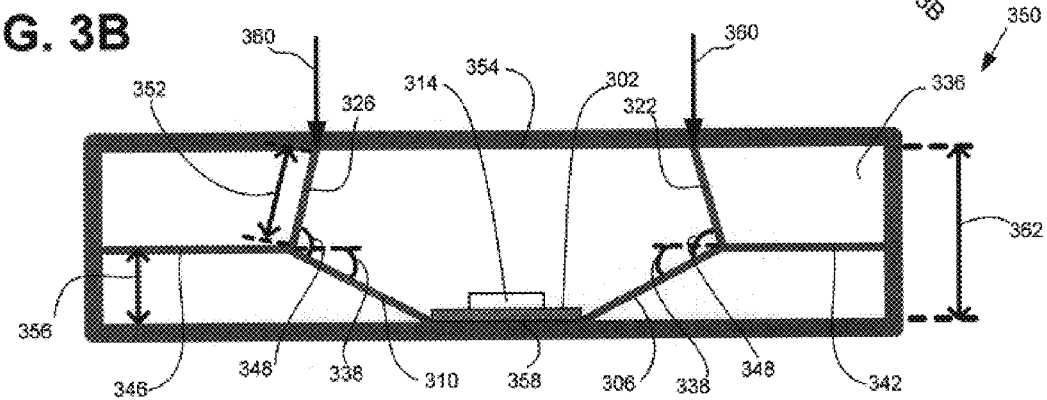
FIG. 3B illustrates a cross section view of the invention's tabs after the leadframe has been encapsulated in mold compound in a mold cavity.

FIG. 3B shows a cross section of leadframe 300 at a later stage in the fabrication process after leadframe 300 has been placed inside mold cavity 350 in a molding machine (not shown in any of the Figures). Where the cross section of leadframe 300 is taken is shown in FIG. 3A by cross section line 3B, also referred to by numeral 334.

Leadframe 300 is a deep downset leadframe. In other words, leadframe 300 has undergone a mechanical forming process whereby paddle 302 and inner tie bars 304, 306, 308, and 310 are set down beneath the horizontal plane of the remainder of leadframe 300 to form a deep downset paddle configuration as shown in FIG. 3B. The downset distance, referred to by numeral 356, is chosen so that the bottom surface of paddle 302 is situated flush with floor 358 of mold cavity 350. In the present embodiment, inner tie bars 304, 306, 308, and 310 are set down at an angle of approximately 30 degrees relative to their respective frame bars. This angle is referred to by numeral 338. Only inner tie bars 306 and 310 can be seen in the cross section view of FIG. 3B.

As discussed above, in addition to the down setting of paddle 302 and inner tie bars 304, 306, 308, and 310, the invention's tabs 320, 322, 324, and 326 are pulled back away from their respective tie bars. It is clear from FIG. 3B that tabs 320, 322, 324, and 326 are not in the same plane as frame 301, but protrude upward at an angle of approximately 105 degrees relative to their respective tie bars. This angle is referred to by numeral 348. Only tabs 322 and 326 can be seen in FIG. 3B.

Length 352 and angle 348 of tabs 320, 322, 324, and 326 are chosen in order to ensure that the upper ends of tabs 320, 322, 324, and 326 will be in contact with the ceiling 354 of mold cavity 350, when the molding machine is closed. The function of tabs 320, 322, 324, and 326 in relation to ceiling 354 of mold cavity 350 is discussed in more detail below.

During the molding process, leadframe 300, including attached semiconductor die 314 and the accompanying bond wires, are placed in mold cavity 350 in a molding machine. The molding machine closes and clamps and mold cavity 350 is then injected with mold compound 336. Mold compound 336 penetrates mold cavity 350 and is forced around, and eventually encapsulates, leadframe 300, including the top surface of paddle 302, and semiconductor die 314. Mold compound 336 hardens during a curing cycle and the molding machine opens after the curing cycle and ejects the encapsulated leadframe 300. In the present embodiment, mold compound 336 can comprise a semiconductor grade mold compound such as multifunctional epoxy, novolac, and biphenyl resin, and which can specifically be selected from commercially available compounds such as Sumitomo®

7351 or Sumitomo® 7320. Mold compound 336 can have a thickness, referred to by numeral 362, of approximately 1.4 millimeters.

As discussed above, during the wire bonding or die attach processes, deformation may occur to leadframe 300. As a result of this deformation, paddle 302 may be pushed up, thereby changing downset distance 356. In the absence of the present invention, the bottom surface of paddle 302 may not be flush with floor 358 of mold cavity 350, but may be situated slightly above floor 358. Therefore, in the absence of the present invention, a deformed leadframe 300 may allow mold compound 336 to penetrate beneath paddle 302 leading to the undesirable consequences discussed above.

The invention's tabs 320, 322, 324, and 326 overcome this deformation problem since tabs 320, 322, 324, and 326 are compressed by the downward force of ceiling 354 when the molding machine closes. This downward force from ceiling 354 on tabs 320, 322, 324, and 326, which is represented in FIG. 3B by arrows 360, is transferred to inner tie bars 304, 306, 308, and 310, located at the four respective corners of paddle 302, and compresses inner tie bars 304, 306, 308, and 310 in a downward direction when the molding machine is closed. Because paddle 302 is attached to inner tie bars 304, 306, 308, and 310, it also is compressed in a downward direction along with inner tie bars 304, 306, 308, and 310. As such, paddle 302 is pressed against floor 358 of mold cavity 350.

As discussed above, length 352 and angle 348 of tabs 320, 322, 324, and 326 are chosen in order to ensure that tabs 320, 322, 324, and 326 will be in contact with ceiling 354 of mold cavity 350 when the molding machine is closed. Angle 348 of tabs 320, 322, 324, and 326 is also chosen to ensure that there is good compression of the tabs by ceiling 354 and to avoid deformation of tabs 320, 322, 324, and 326 from the downward pressure of ceiling 354.

As a result of the invention, when a deformed leadframe 300 is placed inside mold cavity 350 and ceiling 354 is brought into contact with the upper ends of tabs 320, 322, 324, and 326 as the molding machine closes and clamps, ceiling 354 will push tabs 320, 322, 324, and 326 down along with inner tie bars 304, 306, 308, and 310 and paddle 302 until the bottom surface of paddle 302 is pressed firmly against floor 358 of mold cavity 350. In this manner, the invention ensures that during the molding process the bottom surface of paddle 302 is kept firmly in contact with floor 358 of mold cavity 350 to ensure that flash molding is eliminated. Accordingly, the bottom surface of paddle 302 will be ready for soldering to the printed circuit board without a deflashing process. Moreover, the invention results in fewer rejected molded packages and will also reduce the cost and time associated with the packaging process.

In addition, as was noted above, even after a deflashing process, leadframes without the invention's tabs sometimes retain a small residue of mold compound on the bottom surface of the paddle which results in an increased inductance in the ground connection of the semiconductor die and an unreliable mechanical connection of the paddle to the printed circuit board. In contrast, as a result of the invention, the absence of any mold compound residue on the bottom surface of paddle 302 results in a reduction in the inductance in the ground connection of the semiconductor die, along with a more reliable mechanical connection between paddle 302 and the printed circuit board.

From the above description of the invention it is manifest that various techniques can be used for implementing the concepts of the present invention without departing from its scope. Moreover, while the invention has been described with specific reference to certain embodiments, a person of ordinary skill in the art would recognize that changes can be made in form and detail without departing from the spirit and the scope of the invention. The described embodiments are to be considered in all respects as illustrative and not restrictive. It should also be understood that the invention is not limited to the particular embodiments described herein, but is capable of many rearrangements, modifications, and substitutions without departing from the scope of the invention.

Thus an exposed paddle leadframe for semiconductor die packaging has been described.

What is claimed is:

1. A leadframe comprising:

a paddle suitable for receiving a semiconductor die, said paddle being attached to a frame of said leadframe by at least one tie bar;

said leadframe having an integral portion, said integral portion of said leadframe being bent at a first nonzero angle relative to a plane of said at least one tie bar, said integral portion of said leadframe being bent at a second nonzero angle relative to a plane of said frame; said integral portion having a first end attached to said leadframe and a second end unattached to said leadframe, said first end of said integral portion pressing said paddle towards a floor of a molding machine cavity so that a bottom surface of said paddle is situated substantially flush with said floor of said molding machine cavity when said second end of said integral portion is compressed by a ceiling of said molding machine cavity.

2. The leadframe of claim 1 wherein said integral portion of said leadframe is etched into said at least one tie bar.

3. The leadframe of claim 1 wherein said first nonzero angle is greater than 90 degrees.

4. The leadframe of claim 1 wherein said at least one tie bar forms an angle that is less than 90 degrees with said plane of said frame.

5. The leadframe of claim 1 wherein said leadframe comprises a plurality of integral portions and a plurality of tie bars, each of said plurality of integral portions of said leadframe being bent at said first nonzero angle relative to a plane of said plurality of tie bars, and wherein each of said plurality of integral portions of said leadframe is bent at said second nonzero angle relative to said plane of said frame.

6. The leadframe of claim 1 wherein a top surface of said paddle comprises silver-plated copper.

7. The leadframe of claim 1 wherein a bottom surface of said paddle comprises copper.

8. The leadframe of claim 1 wherein said frame, said at least one tie bar, and said integral portion of said leadframe comprise copper.

9. A leadframe comprising:

a paddle suitable for receiving a semiconductor die, said paddle being attached to a frame of said leadframe by a plurality of tie bars;

a leadframe etched tab being an integral part of said leadframe, said leadframe etched tab being bent at a first nonzero angle relative to a plane of one of said plurality of tie bars, said leadframe etched tab being bent at a second nonzero angle relative to a plane of said frame; said leadframe etched tab having a first end attached to said leadframe and a second end unattached to said leadframe, said first end of said leadframe etched tab pressing said paddle towards a floor of a molding machine cavity so that a bottom surface of said paddle is situated substantially flush with said floor of said molding machine cavity when said second end of said leadframe etched tab is compressed by a ceiling of said molding machine cavity.

10. The leadframe of claim 9 wherein said leadframe etched tab is etched into said one of said plurality of tie bars.

11. The leadframe of claim 9 wherein said first nonzero angle is greater than 90 degrees.

12. The leadframe of claim 9 wherein said one of said plurality of tie bar forms an angle that is less than 90 degrees with said plane of said frame.

13. The leadframe of claim 9 wherein said leadframe comprises a plurality of leadframe etched tabs, each of said plurality of leadframe etched tabs being bent at said first nonzero angle relative to a plane of said plurality of tie bars, and wherein each of said plurality of leadframe etched tabs is bent at said second nonzero angle relative to said plane of said frame.

14. The leadframe of claim 9 wherein a top surface of said paddle comprises silver-plated copper.

15. The leadframe of claim 9 wherein a bottom surface of said paddle comprises copper.

16. The leadframe of claim 9 wherein said frame, said plurality of tie bars, and said leadframe etched tab comprise copper.

* * * * *